United States Patent
Takahashi et al.

(10) Patent No.: US 12,009,217 B2
(45) Date of Patent: Jun. 11, 2024

(54) SUBSTRATE PROCESSING METHOD AND SUBSTRATE PROCESSING APPARATUS

(71) Applicant: Tokyo Electron Limited, Tokyo (JP)

(72) Inventors: Tsuyoshi Takahashi, Nirasaki (JP); Yu Nunoshige, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 263 days.

(21) Appl. No.: 17/593,071

(22) PCT Filed: Mar. 4, 2020

(86) PCT No.: PCT/JP2020/009209
§ 371 (c)(1),
(2) Date: Sep. 8, 2021

(87) PCT Pub. No.: WO2020/184342
PCT Pub. Date: Sep. 17, 2020

(65) Prior Publication Data
US 2022/0189779 A1    Jun. 16, 2022

(30) Foreign Application Priority Data
Mar. 13, 2019  (JP) .................. 2019-046346

(51) Int. Cl.
*H01L 21/285* (2006.01)
*C23C 16/34* (2006.01)
*C23C 16/455* (2006.01)
*C23C 16/505* (2006.01)
*H01J 37/32* (2006.01)

(52) U.S. Cl.
CPC ........ *H01L 21/28568* (2013.01); *C23C 16/34* (2013.01); *C23C 16/4554* (2013.01); *C23C 16/505* (2013.01); *H01J 37/32082* (2013.01); *H01J 37/3244* (2013.01); *H01J 2237/338* (2013.01)

(58) Field of Classification Search
None
See application file for complete search history.

(56) References Cited

U.S. PATENT DOCUMENTS

2010/0255625 A1* 10/2010 De Vries ............. C23C 16/4554
427/535
2017/0182514 A1*  6/2017 Kumagai .......... C23C 16/45551

FOREIGN PATENT DOCUMENTS

JP    2005-248231 A    9/2005
JP    2017-120884 A    7/2017

* cited by examiner

*Primary Examiner* — Asok K Sarkar
(74) *Attorney, Agent, or Firm* — Armstrong Teasdale LLP

(57) ABSTRACT

Provided are a substrate processing method and a substrate processing apparatus for forming a low-resistance metal-containing nitride film. The substrate processing method includes: a step of providing a substrate in a processing container; a step of forming a metal-containing nitride film on the substrate by repeating supplying an organic metal-containing gas and a nitrogen-containing gas alternately for a first predetermined number of cycles; a step of modifying the metal-containing nitride film by generating plasma in the processing container; and a step of repeating the step of forming the metal-containing nitride film and the step of modifying the metal-containing nitride film for a second predetermined number of cycles.

8 Claims, 6 Drawing Sheets

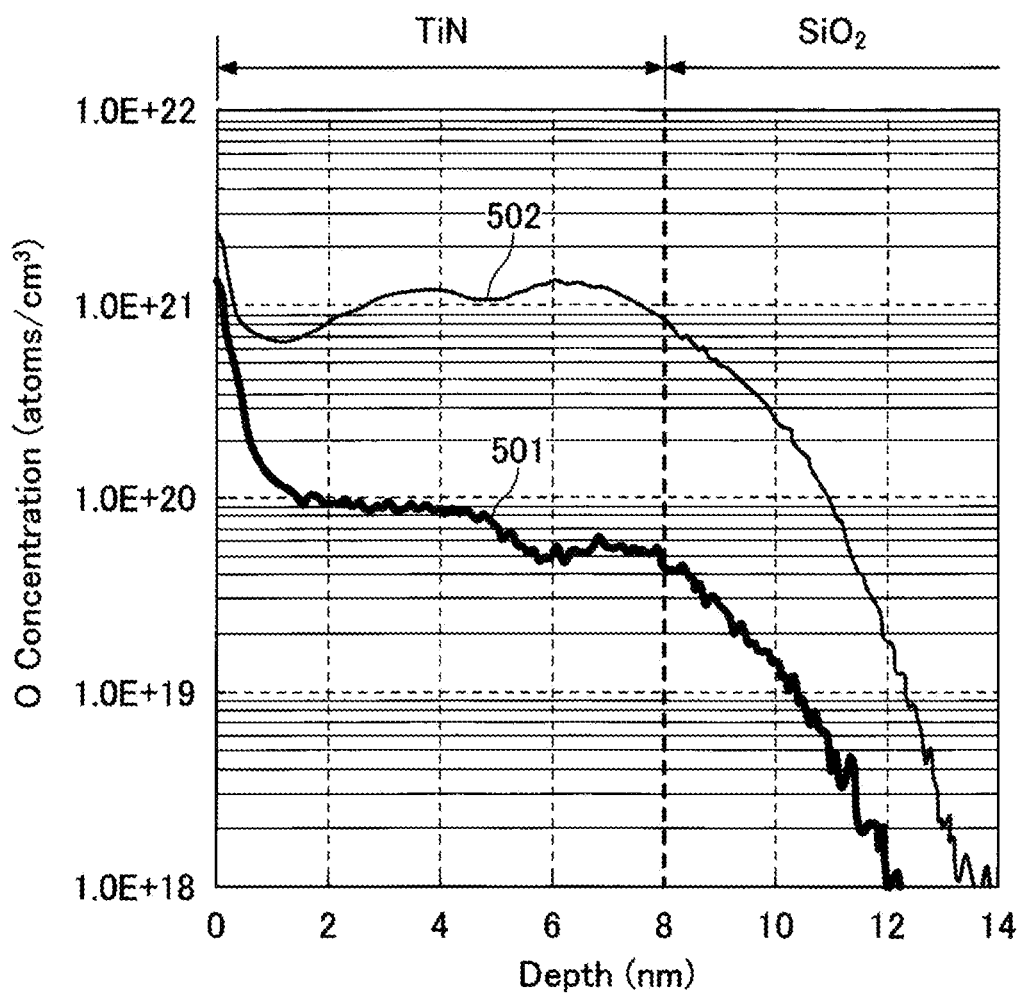

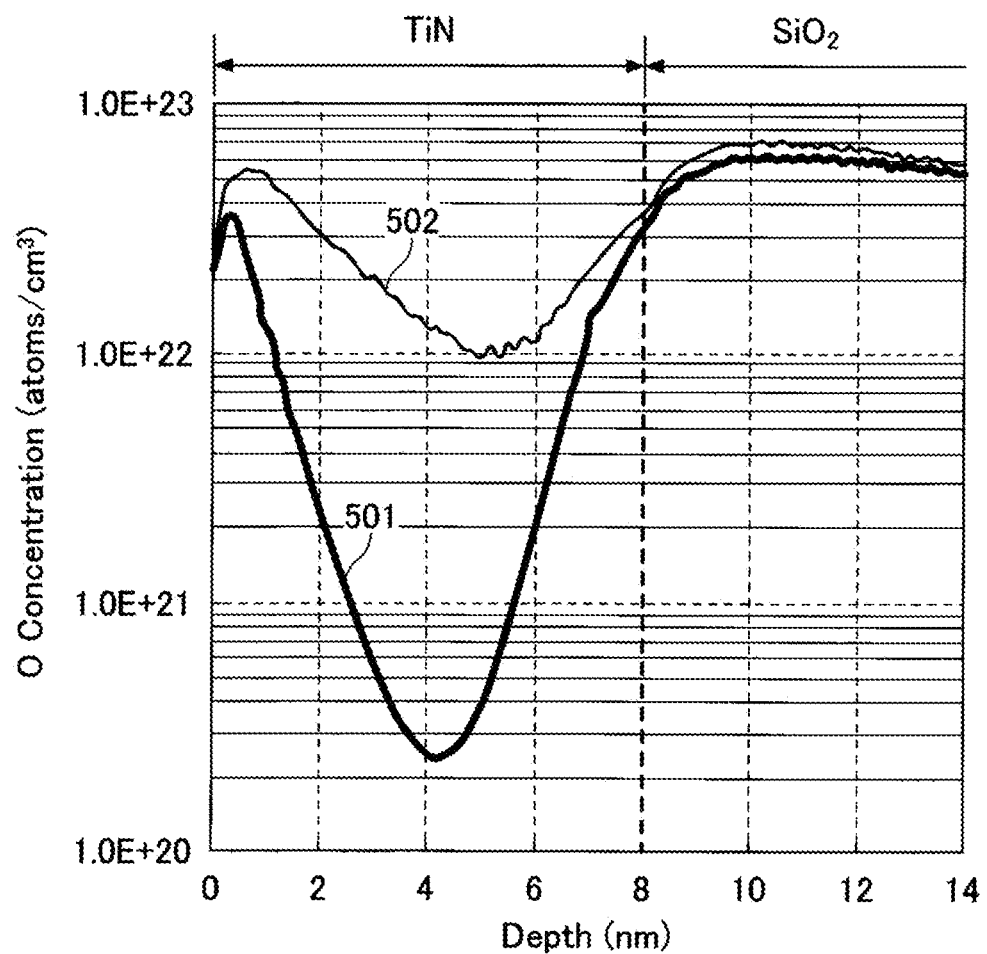

SUBSTRATE PROCESSING METHOD AND SUBSTRATE PROCESSING APPARATUS

CROSS-REFERENCE TO RELATED APPLICATIONS

This application is a National Stage Application of International Patent Application No. PCT/JP2020/009209, having an International Filing Date of Mar. 4, 2020, which claims the benefit of priority to Japanese Patent Application No. 2019-046346, filed Mar. 13, 2019, each of which is hereby incorporated by reference herein.

TECHNICAL FIELD

The present disclosure relates to a substrate processing method and a substrate processing apparatus.

BACKGROUND

For example, a substrate processing apparatus for forming a metal-containing film on the surface of a substrate such as a wafer has been known.

Patent Document 1 discloses a substrate processing apparatus for forming a Ti film or the like using $TiCl_4$ gas and a reduction gas.

PRIOR ART DOCUMENTS

Patent Documents

Patent Document 1: Japanese Laid-Open Patent Publication No. 2005-248231

In an aspect, the present disclosure provides a substrate processing method and a substrate processing apparatus for forming a low-resistance metal-containing nitride film.

SUMMARY

In view of the foregoing, an aspect provides a substrate processing method including: a step of providing a substrate in a processing container; a step of forming a metal-containing nitride film on the substrate by repeating supplying an organic metal-containing gas and a nitrogen-containing gas alternately for a first predetermined number of cycles; a step of modifying the metal-containing nitride film by generating plasma in the processing container; and a step of repeating the step of forming the metal-containing nitride film and the step of modifying the metal-containing nitride film for a second predetermined number of cycles.

According to an aspect, it is possible to provide a substrate processing method and a substrate processing apparatus for forming a low-resistance metal-containing nitride film.

BRIEF DESCRIPTION OF DRAWINGS

FIG. 5A is a graph showing the results of secondary ion mass spectrometry.

FIG. 5B is a graph showing the results of secondary ion mass spectrometry.

DETAILED DESCRIPTION

Figure 1:
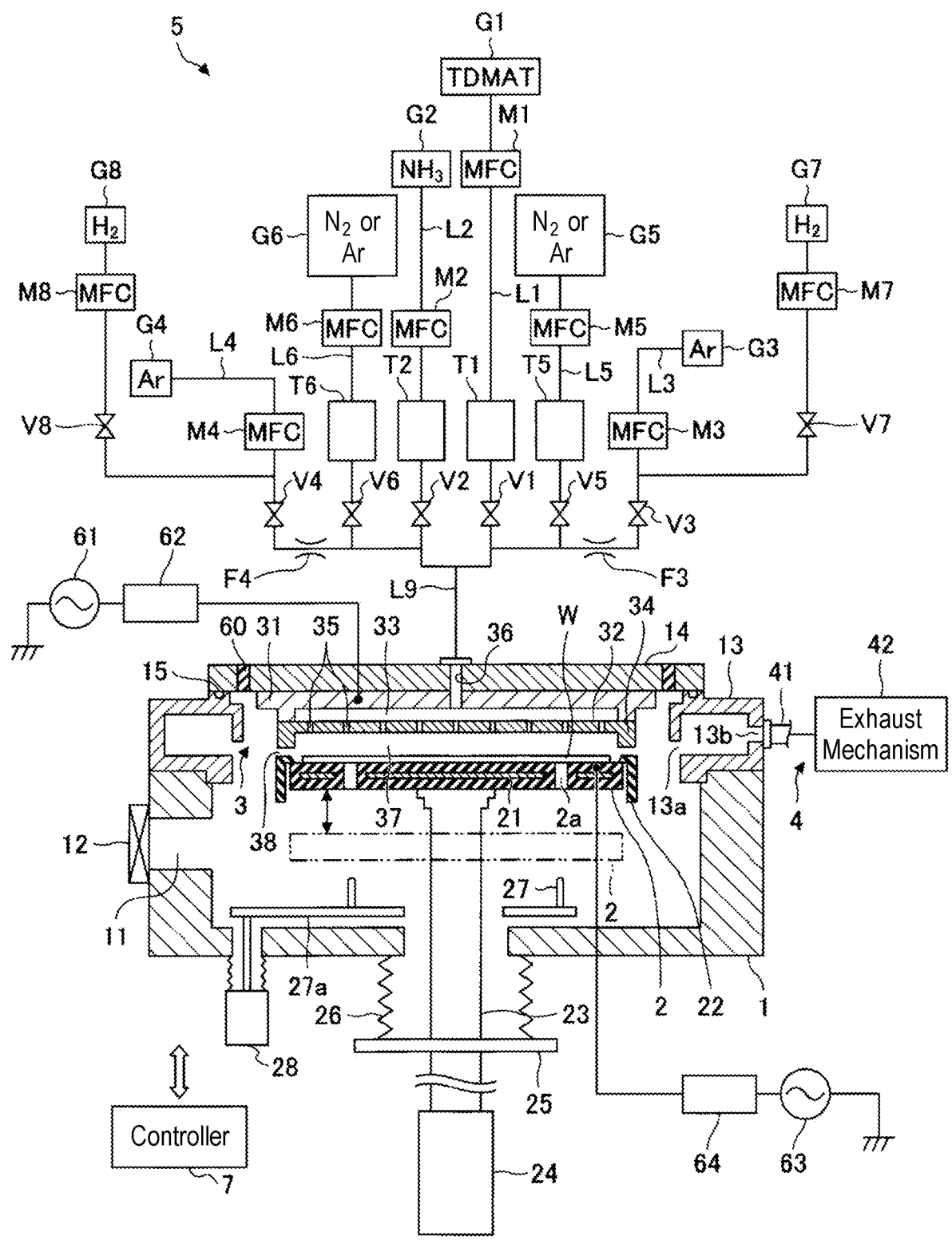
FIG. 1 is an exemplary schematic cross-sectional view of a substrate processing apparatus according to an embodiment.

Hereinafter, embodiments of the present disclosure will be described with reference to the accompanying drawings. In each of the drawings, the same components are denoted by the same reference numerals, and redundant descriptions thereof may be omitted.

<Substrate Processing Apparatus>

A substrate processing apparatus 100 according to an embodiment will be described with reference to FIG. 1. FIG. 1 is an exemplary schematic cross-sectional view illustrating a substrate processing apparatus 100 according to the embodiment. The substrate processing apparatus 100 is an apparatus for forming a metal-containing nitride film (e.g., TiN) on the surface of a substrate W by supplying an organic metal-containing gas as a raw-material gas (precursor) and a nitrogen-containing gas as a reduction gas to a substrate W such as a wafer.

As illustrated in FIG. 1, the substrate processing apparatus 100 includes a processing container 1, a substrate placement stage 2, a shower head 3, an exhaust part 4, a processing gas supply mechanism 5, and a controller 7.

The processing container 1 is made of a metal such as aluminum, and has a substantially cylindrical shape. A carry-in/out port 11 is formed in the side wall of the processing container 1 to carry in or carry out a substrate W therethrough, and the carry-in/out port 11 is configured to be opened/closed by a gate valve 12. An annular exhaust duct 13 having a rectangular cross section is provided on the body of the processing container 1. The exhaust duct 13 has a slit 13a formed along the inner peripheral surface thereof. In addition, an exhaust port 13b is formed in the outer wall of the exhaust duct 13. On the top surface of the exhaust duct 13, a ceiling wall 14 is provided so as to close the upper opening of the processing container 1. The space between the ceiling wall 14 and the exhaust duct 13 is hermetically sealed with a seal ring 15.

The substrate placement stage 2 horizontally supports a substrate W in the processing container 1. The substrate placement stage 2 has a disk shape having a size corresponding to the substrate W, and is supported by a support member 23. The substrate placement stage 2 is made of a ceramic material such as aluminum nitride (AlN) or a metal material such as aluminum or a nickel-based alloy, and a heater 21 is embedded in the substrate placement stage 2 in order to heat the substrate W. The heater 21 generates heat by being supplied with power from a heater power supply (not illustrated). Then, by controlling the output of the heater 21 based on a temperature signal of a thermocouple (not illustrated) provided in the vicinity of the wafer placement surface of the top surface of the substrate placement stage 2, the temperature of the substrate W is controlled to a predetermined temperature.

The substrate placement stage 2 is provided with a cover member 22 made of ceramic, such as alumina, so as to cover the outer peripheral region of the wafer placement surface and the side surface of the substrate placement stage 2.

The support member 23 extends to the lower side of the processing container 1 through a hole formed in the bottom wall of the processing container 1 from the center of the bottom surface of the substrate placement stage 2, and is connected to a lifting mechanism 24 at the lower end thereof. The substrate placement stage 2 is configured to be capable of being raised/lowered via the support member 23 by the lifting mechanism 24 between a processing position illustrated in FIG. 1 and a transport position (indicated by the two-dot chain line below the processing position) at which a wafer is capable of being transported. In addition, a flange part 25 is provided on the support member 23 below the processing container 1, and a bellows 26, which partitions the atmosphere within the processing container 1 from the outside air, is provided between the bottom surface of the processing container 1 and the flange part 25 to expand/contract in response to the raised/lowered movement of the substrate placement stage 2.

Three wafer support pins 27 (of which only two are illustrated) are provided in the vicinity of the bottom surface of the processing container 1 so as to protrude upwards from a lifting plate 27a. The wafer support pins 27 are configured to be capable of being raised/lowered via the lifting plate 27a by the lifting mechanism 28 provided below the processing container 1, and are inserted into through holes 2a provided in the substrate placement stage 2 located at the transport position to be capable of protruding or retracting with respect to the top surface of the substrate placement stage 2. By raising and lowering the wafer support pins 27 in this manner, the substrate W is delivered between the wafer transport mechanism (not illustrated) and the substrate placement stage 2.

The shower head 3 supplies a processing gas into the processing container 1 in the form of a shower. The shower head 3 is made of a metal and is provided to face the substrate placement stage 2. The shower head 3 has a diameter that is substantially equal to that of the substrate placement stage 2. The shower head 3 has a body 31 fixed to the ceiling wall 14 of the processing container 1 and a shower plate 32 connected to the lower side of the body 31. A gas diffusion space 33 is formed between the body 31 and the shower plate 32. In the gas diffusion space 33, a gas inlet hole 36 is provided through the centers of the body 31 and the ceiling wall 14 of the processing container 1. An annular protrusion 34 protruding downwards is formed at the peripheral edge portion of the shower plate 32, and gas ejection holes 35 are formed in the flat surface inside the annular protrusion 34 of the shower plate 32.

In the state in which the substrate placement stage 2 is located at the processing position, a processing space 37 is formed between the shower plate 32 and the substrate placement stage 2, and the annular protrusion 34 and the top surface of the cover member 22 of the substrate placement stage 2 are located close to each other so as to form an annular gap 38 therebetween.

The exhaust part 4 evacuates the inside of the processing container 1. The exhaust part 4 includes an exhaust pipe 41 connected to the exhaust port 13b of the exhaust duct 13, and an exhaust mechanism 42 connected to the exhaust pipe 41 and including a vacuum pump, a pressure control valve, and the like. During processing, the gas in the processing container 1 reaches the exhaust duct 13 through the slit 13a, and is exhausted from the exhaust duct 13 through the exhaust pipe 41 by the exhaust mechanism 42 of the exhaust part 4.

The processing gas supply mechanism 5 includes a raw-material gas supply line L1, a nitriding gas supply line L2, a first continuous Ar gas supply line L3, a second continuous Ar gas supply line L4, a first flash purge line L5, a second flash purge line L6, a first $H_2$ gas supply line L7, and a second $H_2$ gas supply line L8.

The raw-material gas supply line L1 extends from a raw-material gas supply source G1, which is a supply source of an organic metal-containing gas (e.g., TDMAT gas), and is connected to a junction pipe L9. The junction pipe L9 is connected to the gas inlet hole 36. The raw-material gas supply line L1 is provided with a mass flow controller M1, a buffer tank T1, and an opening/closing valve V1 in that order from the raw-material gas supply source G1 side. The mass flow controller M1 controls the flow rate of the TDMAT gas flowing through the raw-material gas supply line L1. The buffer tank T1 temporarily stores the TDMAT gas, and supplies the necessary TDMAT gas in a short time. The opening/closing valve V1 switches the supply of the TDMAT gas and the stop of the supply of the TDMAT gas at high speed during an atomic layer deposition (ALD) process. The organic metal-containing gas is, for example, an organic Ti-containing gas, and, for example, tetrakis dimethylamino titanium (TDMAT), tetrakis ethyl methyl amino titanium (TEMAT), tetrakis diethyl amino titanium (TDEAT), cyclopentadienyl Ti complex, and the like.

The nitriding gas supply line L2 extends from a nitriding gas supply source G2, which is a supply source of a nitrogen-containing gas (e.g., $NH_3$ gas), and is connected to the junction pipe L9. The nitriding gas supply line L2 is provided with a mass flow controller M2, a buffer tank T2, and an opening/closing valve V2 in that order from the nitriding gas supply source G2 side. The mass flow controller M2 controls the flow rate of the $NH_3$ gas flowing through the nitriding gas supply line L2. The buffer tank T2 temporarily stores the $NH_3$ gas, and supplies necessary $NH_3$ gas in a short time. The opening/closing valve V2 switches the supply of the $NH_3$ gas and the stop of the supply of the $NH_3$ gas at high speed during an ALD process. As the nitrogen-containing gas, for example, $NH_3$, monomethylhydrazine (MMH), hydrazine, or the like may be used.

The first continuous Ar gas supply line L3 extends from an Ar gas supply source G3, which is a supply source of Ar gas, and is connected to the raw-material gas supply line L1. Thus, Ar gas is supplied to the raw-material gas supply line L1 side through the first continuous Ar gas supply line L3. The first continuous Ar gas supply line L3 constantly supplies Ar gas during film formation through an ALD method, and the Ar gas functions as a carrier gas of TDMAT gas and also functions as a purge gas. In addition, the first continuous Ar gas supply line L3 supplies Ar gas during a plasma processing process. The first continuous Ar gas supply line L3 is provided with a mass flow controller M3, an opening/closing valve V3, and an orifice F3 in that order from the Ar gas supply source G3 side. The mass flow controller M3 controls the flow rate of the Ar gas flowing through the first continuous Ar gas supply line L3. The orifice F3 suppresses the backflow of the gas of a relatively large flow rate supplied by the buffer tank T1 or T5 into the first continuous Ar gas supply line L3.

The second continuous Ar gas supply line L4 extends from an Ar gas supply source G4, which is a supply source of Ar gas, and is connected to the nitriding gas supply line L2. Thus, Ar gas is supplied to the nitriding gas supply line L2 side through the second continuous Ar gas supply line L4. The second continuous Ar gas supply line L4 constantly supplies Ar gas during film formation through an ALD method, and the Ar gas functions as a carrier gas of $NH_3$ gas and also functions as a purge gas. In addition, the second continuous Ar gas supply line L4 supplies Ar gas during a plasma processing process. The second continuous Ar gas supply line L4 is provided with a mass flow controller M4, an opening/closing valve V4, and an orifice F4 in that order from the Ar gas supply source G4 side. The mass flow controller M4 controls the flow rate of the Ar gas flowing through the second continuous Ar gas supply line L4. The orifice F4 suppresses the backflow of the gas of a relatively large flow rate supplied by the buffer tank T2 or T6 into the second continuous Ar gas supply line L4.

The first flash purge line L5 extends from a flash purge gas supply source G5, which is a supply source of $N_2$ gas or Ar gas as a flash purge gas, and is connected to the first continuous Ar gas supply line L3. Thus, $N_2$ gas or Ar gas is supplied to the raw-material gas supply line L1 side through the first flash purge line L5 and the first continuous Ar gas supply line L3. The first flash purge line L5 supplies $N_2$ gas or Ar gas only in a purge step during film formation through an ALD method. The first flash purge line L5 is provided with a mass flow controller M5, a buffer tank T5, and an opening/closing valve V5 in that order from the flash purge gas supply source G5 side. The mass flow controller M5 controls the flow rate of the $N_2$ gas or Ar gas flowing through the first flash purge line L5. The buffer tank T5 temporarily stores the $N_2$ gas or Ar gas, and supplies necessary $N_2$ gas or Ar gas in a short time. The opening/closing valve V5 switches the supply of the $N_2$ gas or Ar gas and the stop of the supply of the $N_2$ gas or Ar gas at high speed during purge in an ALD process.

The second flash purge line L6 extends from a flash purge gas supply source G6, which is a supply source of $N_2$ gas or Ar gas as a flash purge gas, and is connected to the second continuous Ar gas supply line L4. Thus, $N_2$ gas or Ar gas is supplied to the nitriding gas supply line L2 side through the second flash purge line L6 and the second continuous Ar gas supply line L4. The second flash purge line L6 supplies $N_2$ gas or Ar gas only in a purge step during film formation through an ALD method. The second flash purge line L6 is provided with a mass flow controller M6, a buffer tank T6, and an opening/closing valve V6 in that order from the flash purge gas supply source G6 side. The mass flow controller M6 controls the flow rate of the $N_2$ gas or Ar gas flowing through the second flash purge line L6. The buffer tank T6 temporarily stores the $N_2$ gas or Ar gas, and supplies necessary $N_2$ gas or Ar gas in a short time. The opening/closing valve V6 switches the supply of the $N_2$ gas or Ar gas and the stop of the supply of the $N_2$ gas or Ar gas at high speed during purge in an ALD process.

The first $H_2$ gas supply line L7 extends from a $H_2$ gas supply source G7, which is a supply source of $H_2$ gas, and is connected to the first continuous Ar gas supply line L3. Thus, $H_2$ gas is supplied to the raw-material gas supply line L1 side through the first $H_2$ gas supply line L7 and the first continuous Ar gas supply line L3. The first $H_2$ gas supply line L7 supplies $H_2$ gas during a plasma processing process. The first $H_2$ gas supply line L7 is provided with a mass flow controller M7 and an opening/closing valve V7 in that order from the $H_2$ gas supply source G7 side. The mass flow controller M7 controls the flow rate of the $H_2$ gas flowing through the first $H_2$ gas supply line L7. The opening/closing valve V7 switches the supply of the $H_2$ gas and the stop of the supply of the $H_2$ gas during plasma processing.

The second $H_2$ gas supply line L8 extends from a $H_2$ gas supply source G8, which is a supply source of $H_2$ gas, and is connected to the second continuous Ar gas supply line L4. Thus, $H_2$ gas is supplied to the nitriding gas supply line L2 side through the second $H_2$ gas supply line L8 and the second continuous Ar gas supply line L4. The second $H_2$ gas supply line L8 supplies $H_2$ gas during a plasma processing process. The second $H_2$ gas supply line L8 is provided with a mass flow controller M8 and an opening/closing valve V8 in that order from the $H_2$ gas supply source G8 side. The mass flow controller M8 controls the flow rate of the $H_2$ gas flowing through the second $H_2$ gas supply line L8. The opening/closing valve V8 switches the supply of the $H_2$ gas and the stop of the supply of the $H_2$ gas during plasma processing.

The shower head 3 also functions as an upper electrode in a plasma processing process. The first radio frequency power supply 61 is connected to the upper electrode via a matcher 62. The first radio frequency power supply 61 is a power supply that generates first radio frequency power. The first radio frequency power has a frequency suitable for plasma generation, for example, 450 KHz to 60 MHz. The upper electrode is supported on the upper portion of the processing container 1 via an insulating member 60.

The substrate placement stage 2 may have a function as a lower electrode in the plasma processing process. In that case, as illustrated in FIG. 1, the lower electrode (the substrate placement stage 2) is connected to the second radio frequency power supply 63 via a matcher 64. The second radio frequency power supply 63 is a power supply that generates second radio frequency power. The second radio frequency power is used as a radio frequency power for bias for drawing ions into a substrate W, and has a frequency of, for example, 450 KHz to 13.56 MHz.

The controller 7 controls the operation of each part of the substrate processing apparatus 100. The controller 7 includes a central processing unit (CPU), a read only memory (ROM), and a random access memory (RAM). The CPU executes a desired process according to a recipe stored in a storage area of, for example, the RAM. In the recipe, apparatus control information for process conditions is set. The control information may include, for example, gas flow rate, pressure, temperature, and process time. The recipe and a program used by the controller 7 may be stored in, for example, a hard disc or a semiconductor memory. In addition, the recipe or the like may be set in a predetermined position to be read out in the state of being stored in a storage medium readable by a portable computer, such as a CD-ROM or a DVD.

<Operation of Substrate Processing Apparatus 100>

Figure 2:
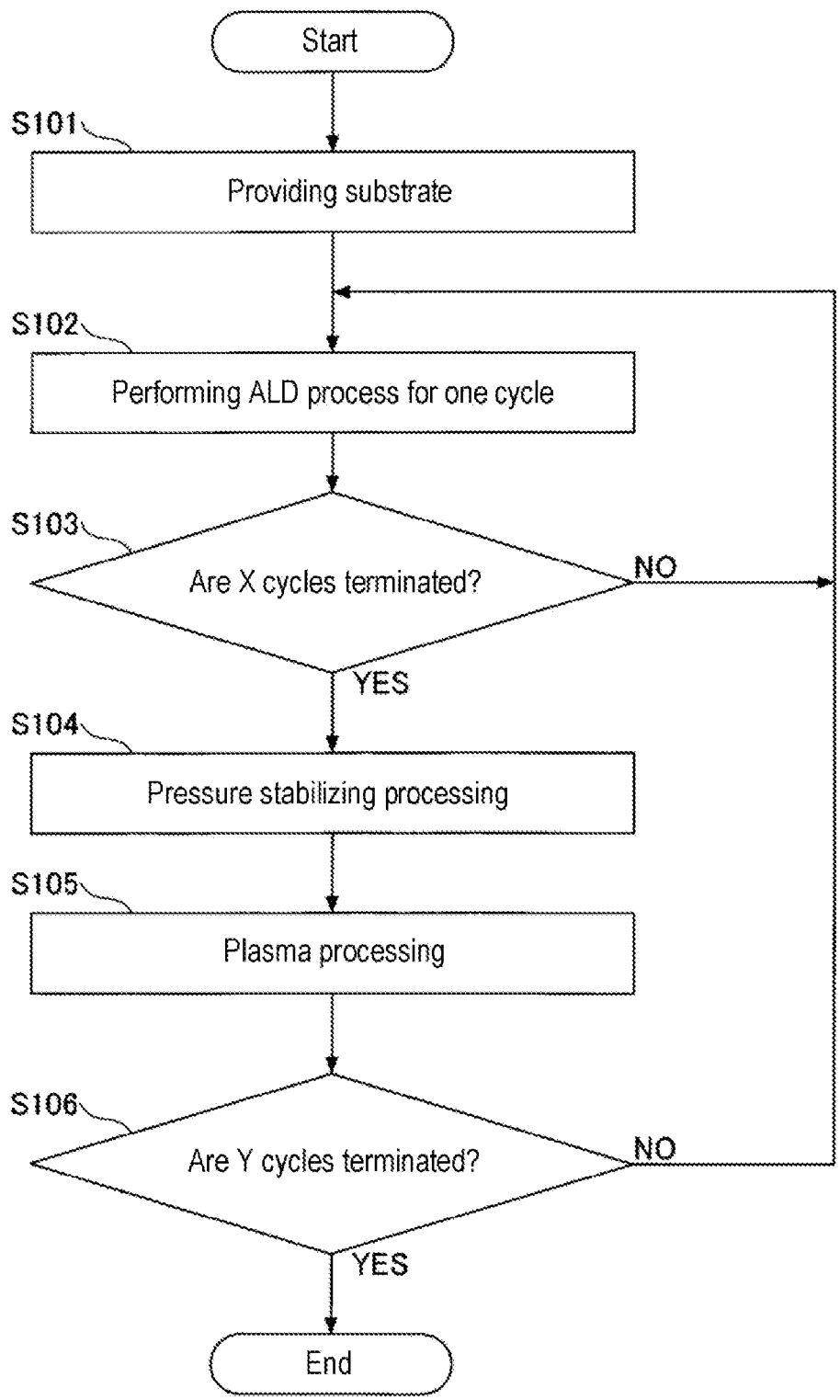
FIG. 2 is a flowchart illustrating exemplary operations in the substrate processing apparatus according to the embodiment.
Figure 3:
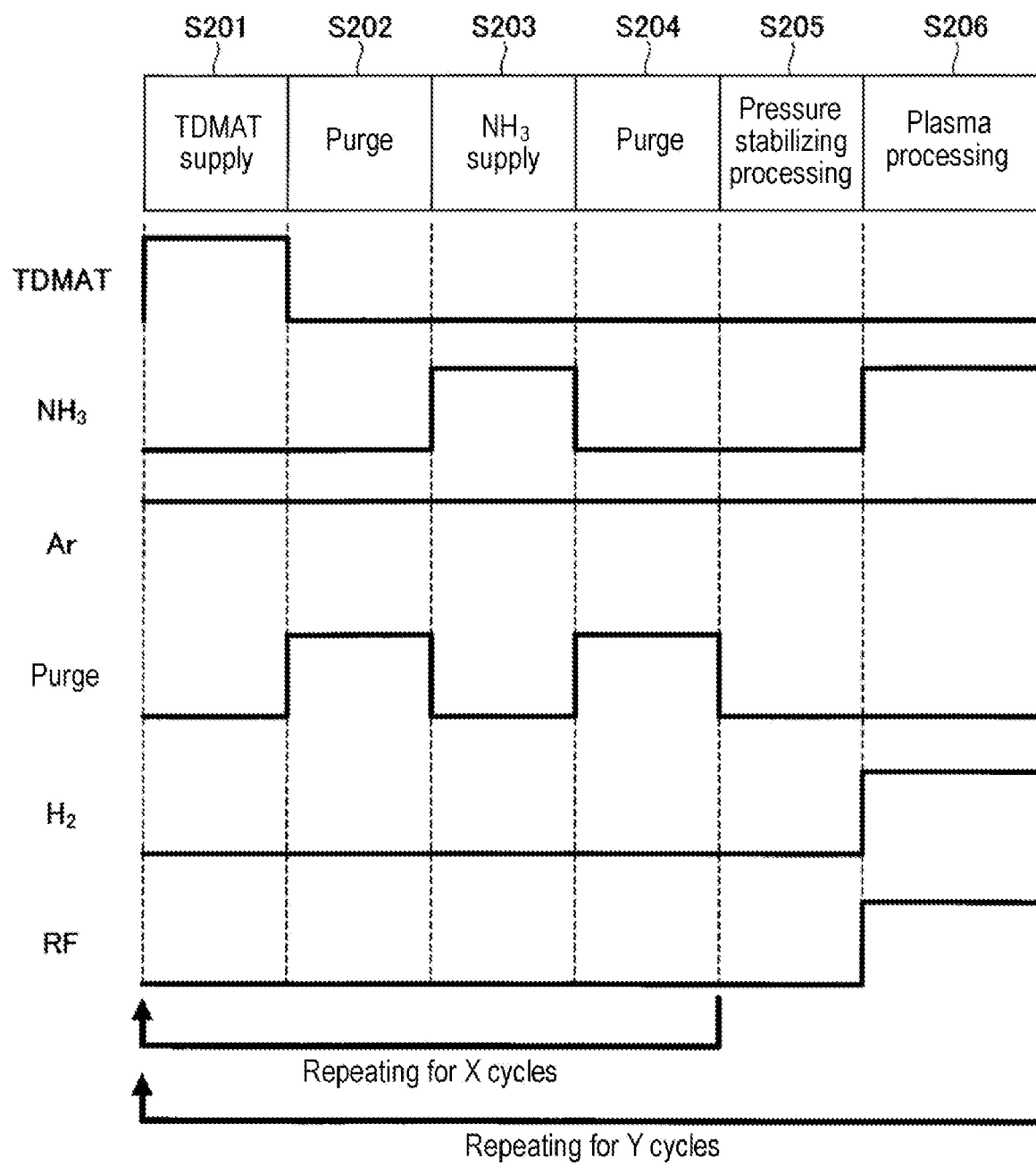
FIG. 3 is a diagram illustrating an exemplary sequence of gas supply and radio frequency wave application in the substrate processing apparatus according to the embodiment.

Next, the operation of the substrate processing apparatus 100 will be described with reference to FIGS. 2 and 3. FIG. 2 is a flowchart illustrating an exemplary operation in the substrate processing apparatus 100 according to the present embodiment. FIG. 3 is a diagram illustrating an exemplary sequence of gas supply and radio frequency wave application in the substrate processing apparatus 100 according to the present embodiment.

In step S101, a substrate W is provided. First, the substrate W is carried into the processing container 1 of the substrate processing apparatus 100 illustrated in FIG. 1. Specifically, the gate valve 12 is opened in the state in which the substrate placement stage 2 is lowered to the transport position. Subsequently, the substrate W is carried into the processing container 1 through the carry-in/out port 11 by a transport arm (not illustrated), and is placed on the substrate placement stage 2 heated to a predetermined temperature (e.g., 150 degrees C. to 400 degrees C.) by the heater 21. Subsequently, the substrate placement stage 2 is raised to the processing position, and the inside of the processing container 1 is decompressed to a predetermined degree of vacuum. Thereafter, the opening/closing valves V3 and V4 are opened, and the opening/closing valves V1, V2, V5, V6, V7, and V8 are closed. As a result, Ar gas is supplied from the Ar gas supply sources G3 and G4 into the processing container 1 through the first continuous Ar gas supply line L3 and the second continuous Ar gas supply line L4 to raise the pressure in the processing container 1 and to stabilize the temperature of the wafer W on the substrate placement stage 2. At this time, TDMAT gas is supplied from the raw-material gas supply source G1 into the buffer tank T1, and thus the pressure in the buffer tank T1 is maintained substantially constant. In addition, NH$_3$ gas is supplied from the nitriding gas supply source G2 into the buffer tank T2, and thus the pressure in the buffer tank T2 is maintained substantially constant. In addition, a flash purge gas (N$_2$ gas or Ar gas) is supplied from the flash purge gas supply sources G5 and G6 into the buffer tanks T5 and T6, and thus the pressure in the buffer tanks T5 and T6 is maintained substantially constant.

In step S102, the controller 7 executes an ALD process in which TDMAT gas and NH$_3$ gas are alternately supplied for one cycle. In step S103, the controller 7 determines whether or not X cycles of the ALD process illustrated in step S102 have been terminated. If the X cycles are not terminated (S103: No), the process of the controller 7 returns to step S102 and is repeated until the X cycles are terminated.

Here, as illustrated in FIG. 3, the ALD process is a process for forming a TiN film having a desired thickness on a substrate W by repeating a step of supplying TDMAT gas (S201), a step of supplying a purge gas (S202), a step of supplying NH$_3$ gas (S203), and a step of supplying a purge gas (S204) for a predetermined number of cycles.

Step S201 of supplying TDMAT gas is a step of supplying TDMAT gas to the processing space 37. In step S201 of supplying TDMAT gas, first, in the state in which the opening/closing valves V3 and V4 are opened, Ar gas (continuous Ar gas) is continuously supplied from the Ar gas supply sources G3 and G4 through the first continuous Ar gas supply line L3 and the second continuous Ar gas supply line L4. In addition, by opening the opening/closing valve V1, TDMAT gas is supplied to the processing space 37 in the processing container 1 from the raw-material gas supply source G1 through the raw-material gas supply line L1. At this time, the TDMAT gas is temporarily stored in the buffer tank T1 and then supplied into the processing container 1.

Step S202 of supplying a purge gas is a step of purging excess TDMAT gas or the like in the processing space 37. In step S202 of supplying a purge gas, in the state in which the supply of Ar gas (continuous Ar gas) is continued through the first continuous Ar gas supply line L3 and the second continuous Ar gas supply line L4, the opening/closing valve V1 is closed to stop the supply of the TDMAT gas. In addition, the opening/closing valves V5 and V6 are opened to allow a relatively large flow rate of purge gas (N$_2$ gas or Ar gas) supplied by the buffer tanks T5 and T6 to flow. As a result, excess TDMAT gas or the like in the processing space 37 is purged.

Step S203 of supplying NH$_3$ gas is a step of supplying NH$_3$ gas to the processing space 37. In step S203 of supplying NH$_3$ gas, in the state in which the supply of Ar gas (continuous Ar gas) is continued through the first continuous Ar gas supply line L3 and the second continuous Ar gas supply line L4, the opening/closing valve V2 is opened. As a result, NH$_3$ gas is supplied to the processing space 37 from the nitriding gas supply source G2 through the nitriding gas supply line L2. At this time, the NH$_3$ gas is temporarily stored in the buffer tank T2 and then supplied into the processing container 1. The TDMAT adsorbed on the substrate W is nitrided by step S203 of supplying NH$_3$ gas. The flow rate of the NH$_3$ gas at this time may be set to an amount that sufficiently causes a nitriding reaction.

Step S204 of supplying a purge gas is a step of purging excess NH$_3$ gas in the processing space 37. In step S204 of supplying a purge gas, in the state in which the supply of Ar gas (continuous Ar gas) is continued through the first continuous Ar gas supply line L3 and the second continuous Ar gas supply line L4, the opening/closing valve V2 is closed to stop the supply of the NH$_3$ gas. In addition, the opening/closing valves V5 and V6 are opened to allow a relatively large flow rate of purge gas (N$_2$ gas or Ar gas) supplied by the buffer tanks T5 and T6 to flow. As a result, excess NH$_3$ gas or the like in the processing space 37 is purged.

As described above, a TiN film, which is a metal-containing nitride film, is formed by repeating an ALD process for a predetermined number of cycles (X cycles) while controlling the temperature of the substrate W to a predetermined temperature by the heater 21. Here, carbon (C) derived from TDMAT, which is a precursor, remains in the formed TiN film. The X cycles correspond to an example of "a first predetermined number of cycles" when the step of alternately supplying an organic metal-containing gas and a nitrogen-containing gas is repeated as the first predetermined cycle, wherein X is an integer of 1 or more.

Here, exemplary process conditions of an ALD process are illustrated below.

TDMAT supply time [S201]/purge time [S202]/NH$_3$ supply time [S203]/purge time [S204]: 0.4 sec/3.0 sec/3.0 sec/3.0 sec TDMAT: 97.5 sccm (~0.1 mg/min)

NH$_3$: 700 sccm

Purge gas: Ar 6000 sccm

Carrier gas: Ar gas

Returning to FIG. 2, when X cycles are terminated (S103: Yes), the process of the controller 7 proceeds to step S104. In step S104, the controller 7 performs pressure stabilizing processing for stabilizing the pressure in the processing container 1 in preparation for performing plasma processing in the subsequent stage. In FIG. 3, this is illustrated as "pressure stabilizing processing" of S205. The substrate processing apparatus 100 according to the present embodiment performs an ALD process and plasma processing in one processing container 1. Therefore, when shifting from the ALD process to the plasma processing, the pressure in the processing container 1 is stabilized to a predetermined pressure. For example, the controller 7 causes the processing gas supply mechanism 5 (the first continuous Ar gas supply line L3 and the second continuous Ar gas supply line L4) to supply an inert gas, such as Ar gas. In addition, the controller 7 controls the exhaust mechanism 42 to set the pressure in the processing space 37 to a predetermined pressure (for example, 1 Torr to 10 Torr). When the pressure in the processing space 37 reaches the predetermined pressure, the process of the controller 7 proceeds to step S105.

In step S105, the controller 7 performs modification processing on a TiN film through plasma processing. In FIG. 3, this is illustrated as "plasma processing" of S206. Here, when a TiN film is formed in step S102, since an organic metal-containing gas is used as a precursor, carbon derived from the precursor remains in the formed TiN film. In the modification processing illustrated in step S105, the carbon remaining on the TiN film is removed. For example, the controller 7 causes the processing gas supply mechanism 5 to supply Ar gas (the first continuous Ar gas supply line L3 and the second continuous Ar gas supply line L4), H$_2$ gas (the first H$_2$ gas supply line L7 and the second H$_2$ gas supply line L8), NH$_3$ gas (the nitriding gas supply line L2), a carrier gas (the first continuous Ar gas supply line L3 and the second continuous Ar gas supply line L4), and the like to the processing space 37. In addition, the controller 7 uses the first radio frequency power supply 61 and/or the second radio frequency power supply 63 (when the lower electrode is provided) to generate first radio frequency power and/or second radio frequency power supply (when the lower electrode is provided). As a result, plasma containing ammonia radicals (NH*), hydrogen radicals (H*), and ions is generated in the processing space 37. When the TiN film is exposed to the hydrogen radicals, carbon remaining on the TiN film is removed, and the TiN film is modified.

Here, exemplary process conditions for plasma modification processing are illustrated below.

Processing space pressure: 3 Torr
Ar: 2000 sccm
$NH_3$: 1500 sccm
$H_2$: 4500 sccm
RF power: 1500 W
RF frequency: 450 kHz In step S106, the controller 7 determines whether or not Y cycles have been terminated, assuming the entire processing illustrated in steps S102 to S106 as one cycle. When the Y cycles are not terminated (S106: No), the process of the controller 7 returns to step S102 and is repeated until the Y cycles are terminated. When the Y cycles are terminated (S106: Yes), the process of the controller 7 is terminated. The Y cycles correspond to an example of "a second predetermined number of cycles" when the step of forming a metal-containing nitride film and the step of modifying the metal-containing nitride film are repeated for a second predetermined number of cycles, wherein Y is an integer of 1 or more.

Figure 4:
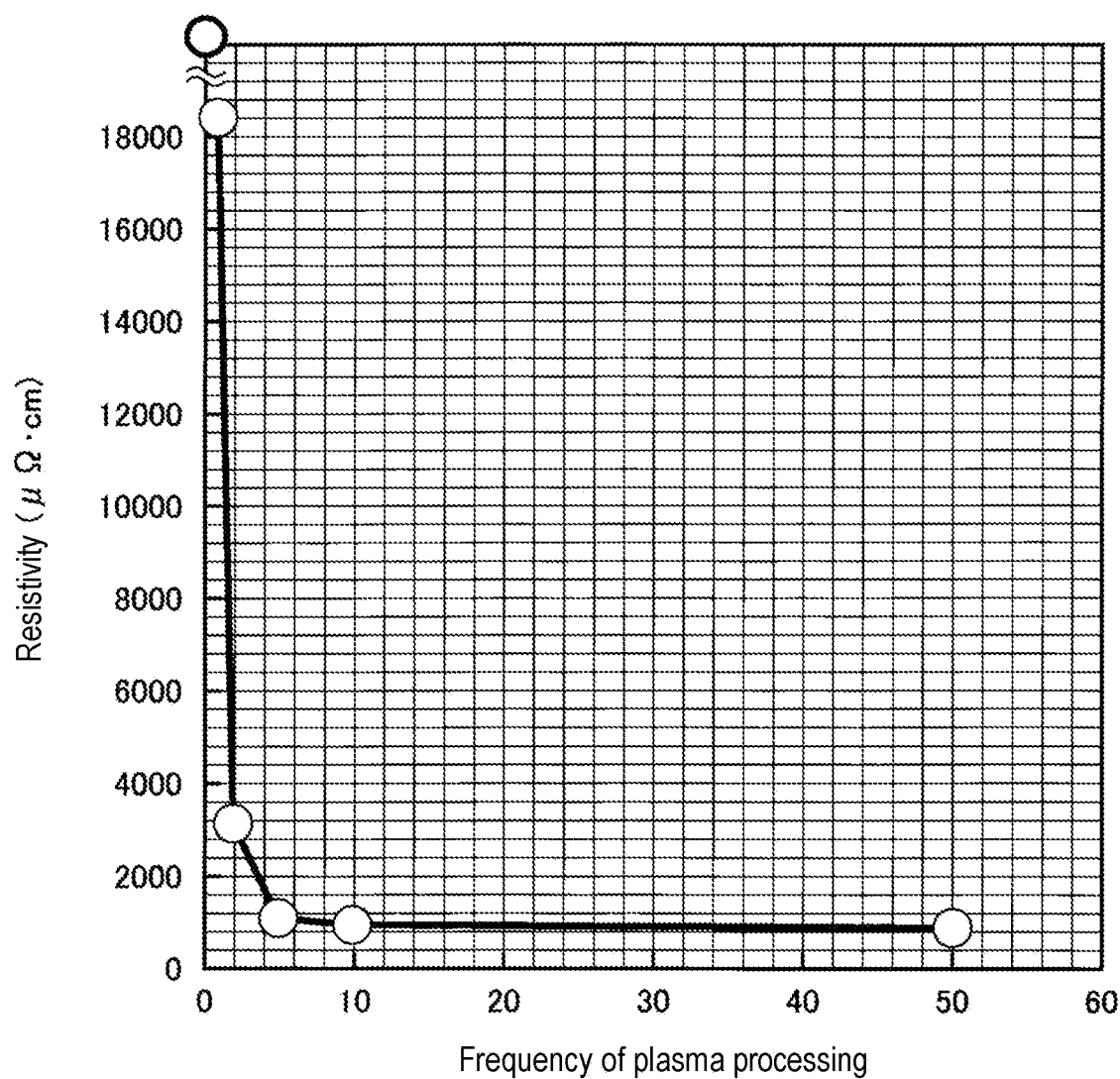
FIG. 4 is a graph showing the relationship between the frequency of plasma processing and resistivity.

FIG. 4 is a graph showing the relationship between the frequency of plasma processing and resistivity. In the example illustrated in FIG. 4, the total number of ALD processes is 50. The vertical axis represents the resistivity of a TiN film, and the horizontal axis represents the frequency of plasma processing. For example, the value of 50 on the horizontal axis corresponds to the case where plasma processing is performed for each cycle of the ALD process (X=1, Y=50). In addition, the value of 10 on the horizontal axis corresponds to the case where plasma processing is performed for every 5 cycles of the ALD process (X=5, Y=10). In addition, the value of 5 on the horizontal axis corresponds to the case where plasma processing is performed for every 10 cycles of the ALD process (X=10, Y=5). In addition, the value of 2 on the horizontal axis corresponds to the case where plasma processing is performed for every 25 cycles of the ALD process (X=25, Y=2). Furthermore, the value of 0 on the horizontal axis corresponds to the case where the ALD process is performed for 50 cycles (X=50, Y=0) without performing the plasma processing.

As illustrated in FIG. 4, when evaluation was made while dividing the frequency of plasma processing from 0 to 50 times, the decrease in resistivity was saturated at 5 to 10 times. In other words, the resistivity of the TiN film was stabilized by performing the plasma processing once for every 5 to 10 cycles of the ALD process. In other words, the resistivity of the TiN film was stabilized by performing the plasma processing every time the thickness of the TiN film was formed by 5 to 10 Å. In other words, the resistivity of the TiN film was stabilized by performing plasma processing every time one or two layers in the atomic layers of the TiN film were formed.

FIGS. 5A and 5B are graphs showing the results of secondary ion mass spectrometry (SIMS). FIG. 5A shows a C concentration profile, and FIG. 5B shows an O concentration profile. Here, the total number of ALD processes was set to 50, and an 8 nm TiN film was formed on $SiO_2$.

In addition, the profile 501 when the frequency of plasma processing was 5 and the profile 502 when the frequency of plasma processing was 0 are illustrated.

As illustrated in FIG. 5A, it was confirmed that it is possible to reduce carbon (C) remaining in a TiN film by performing modification processing by plasma. In addition, as illustrated in FIG. 5B, it was confirmed that it is possible to reduce oxygen (O) remaining in a TiN film by performing modification processing by plasma. The reason why the carbon (C) concentration and the oxygen (O) concentration could be reduced is that hydrogen plasma, which is active radical species in a plasma atmosphere, reacts with carbon atoms in the TiN film to be desorbed as a gas such as methane molecule $CH_4$. In the absence of plasma processing, due to low-temperature film formation, a porous film takes in oxygen into the film by reaction with the atmosphere after the film is formed. However, it can be considered that oxidation resistance is improved by increasing the density of the film by performing plasma processing.

As described above, with the processing method using the substrate processing apparatus 100 according to the present embodiment, it is possible to use an organic metal-containing gas containing no chlorine as a precursor. As a result, compared with a substrate processing method using $TiCl_4$ as a precursor, it is possible to eliminate chlorine (Cl) remaining on a TiN film. As a result, since it is possible to prevent deterioration of the adhesion of the TiN film due to residual chlorine (Cl), it is possible to suppress peeling of the TiN film.

In addition, with the processing method using the substrate processing apparatus 100 according to the present embodiment, it is possible to reduce carbon (C) remaining in a TiN film by plasma processing. As a result, as illustrated in FIG. 4, it is possible to reduce the resistivity of the TiN film.

In addition, with the processing method using the substrate processing apparatus 100 according to the present embodiment, it is possible to reduce the frequency of plasma processings by performing modification processing by plasma after performing a ALD process for multiple cycles (X cycles). As a result, it is possible to reduce the damage to a TiN film and a gate insulating film as a base of the TiN film due to plasma processing while reducing the resistivity. In addition, since it is possible to reduce the frequency of plasma processing, it is possible to improve the throughput of film formation processing in the substrate processing apparatus 100. In addition, in consideration of process temperature dependence, the cycle ratio between the ALD process and the modification processing by plasma is preferably 1:1 (the ratio of one time of modification processing by plasma to one ALD process) to 10:1 (the ratio of one time of modification processing by plasma to 10 ALD processes), and more preferably 5:1 to 10:1. By selecting the optimum cycle ratio according to the process temperature, it is possible to reduce the damage to a TiN film due to plasma processing while reducing the resistivity, and to improve the throughput of film formation processing.

Although the embodiments of the substrate processing apparatus 100 or the like have been described above, the present disclosure is not limited to the above-described embodiments or the like, and can be variously modified and improved within the scope of the gist of the present disclosure described in the claims.

This application claims priority based on Japanese Patent Application No. 2019-046346 filed on Mar. 13, 2019, the entire contents of which are incorporated herein by reference.

EXPLANATION OF REFERENCE NUMERALS

1: processing container, 2: substrate placement stage (stage), 5: processing gas supply mechanism (gas supply part), 7: controller, 22: heater (heat source), 37: processing space, 61: first radio frequency power supply, 63: second radio frequency power supply, 100: substrate processing apparatus

What is claimed is:

1. A substrate processing method comprising:
providing a substrate in a processing container;
forming a metal-containing nitride film on the substrate by repeating supplying an organic metal-containing gas and a nitrogen-containing gas alternately for a first predetermined number of cycles;
modifying the metal-containing nitride film by generating plasma in the processing container; and
repeating the forming the metal-containing nitride film and the modifying the metal-containing nitride film for a second predetermined number of cycles,
wherein a cycle ratio between the supplying the organic metal-containing gas and the nitrogen-containing gas alternately and the modifying the metal-containing nitride film is in a range of 5:1 to 10:1.

2. The substrate processing method of claim 1, wherein the organic metal-containing gas is at least one of TDMAT, TEMAT, TDEAT, and a cyclopentadienyl Ti complex.

3. The substrate processing method of claim 2, wherein the nitrogen-containing gas is at least one of $NH_3$, monomethylhydrazine, and hydrazine.

4. The substrate processing method of claim 3, further comprising:
stabilizing a pressure in a processing space in the processing container before the plasma is generated.

5. The substrate processing method of claim 4, wherein, in the modifying the metal-containing nitride film, plasma of ammonia radicals and hydrogen radicals is generated.

6. The substrate processing method of claim 1, wherein the nitrogen-containing gas is at least one of $NH_3$, monomethylhydrazine, and hydrazine.

7. The substrate processing method of claim 1, further comprising:
stabilizing a pressure in a processing space in the processing container before the plasma is generated.

8. The substrate processing method of claim 1, wherein, in the modifying the metal-containing nitride film, plasma of ammonia radicals and hydrogen radicals is generated.

* * * * *